(12) United States Patent
Wahlsten et al.

(10) Patent No.: US 9,341,962 B2
(45) Date of Patent: *May 17, 2016

(54) METHOD AND APPARATUS FOR PERFORMING PATTERN ALIGNMENT TO DIE

(75) Inventors: Mikael Wahlsten, Stockholm (SE);
Per-Erik Gustafsson, Solna (SE)

(73) Assignee: MYCRONIC AB, Taby (SE)

( * ) Notice: Subject to any disclaimer, the term of this patent is extended or adjusted under 35 U.S.C. 154(b) by 609 days.

This patent is subject to a terminal disclaimer.

(21) Appl. No.: 12/929,976

(22) Filed: Feb. 28, 2011

(65) Prior Publication Data

US 2011/0213479 A1    Sep. 1, 2011

Related U.S. Application Data

(60) Provisional application No. 61/282,547, filed on Feb. 26, 2010, provisional application No. 61/282,561, filed on Mar. 1, 2010, provisional application No. 61/323,047, filed on Apr. 12, 2010, provisional application No. 61/323,048, filed on Apr. 12, 2010, provisional application No. 61/323,685, filed on Apr. 13, 2010.

(51) Int. Cl.
*G06F 17/50* (2006.01)
*G03F 9/00* (2006.01)
(Continued)

(52) U.S. Cl.
CPC .......... *G03F 9/7003* (2013.01); *G03F 7/70383* (2013.01); *H05K 3/4679* (2013.01)

(58) Field of Classification Search
CPC ... G03F 7/70383; G03F 9/7003; G03F 1/144; H05K 2201/09918; H05K 3/4679; G05B 19/4086

USPC ............ 700/97, 135, 176, 121; 382/199, 195
See application file for complete search history.

(56) References Cited

U.S. PATENT DOCUMENTS 4,835,704 A    5/1989  Eichelberger et al.
5,985,680 A *  11/1999 Singhal et al. .................... 438/7
(Continued)

FOREIGN PATENT DOCUMENTS

EP    1381080 A2    1/2004
JP    S63137425 A   6/1988
(Continued)

OTHER PUBLICATIONS

Dodgson, "Image Resampling", Aug. 1992, pp. 1-264.*
(Continued)

*Primary Examiner* — Carlos Ortiz Rodriguez
*Assistant Examiner* — Olvin Lopez Alvarez
(74) *Attorney, Agent, or Firm* — Harness, Dickey & Pierce, P.L.C.

(57) ABSTRACT

In a method for patterning a workpiece provided with dies in a direct write machine, pattern data associated with a selected die, or group of dies, is transformed into adjusted circuit pattern data dependent both on the original pattern data and the transformed positions, wherein the adjusted circuit pattern data represents the circuit pattern of the plurality of dies, or group of dies, such that the adjusted circuit pattern is fitted to a plurality of sub-areas of the workpiece area, and wherein each sub-area is associated with a die, or group of dies, among the plurality of dies distributed on the workpiece. A pattern is then written on the workpiece according to the adjusted circuit pattern data.

29 Claims, 9 Drawing Sheets

(51) Int. Cl.
  *G03F 7/20* (2006.01)
  *H05K 3/46* (2006.01)

(56) References Cited

U.S. PATENT DOCUMENTS

| | | | |
|---|---|---|---|
| 6,084,678 A * | 7/2000 | Matsuura | 356/401 |
| 6,165,658 A * | 12/2000 | Taff et al. | 430/30 |
| 6,205,364 B1 * | 3/2001 | Lichtenstein et al. | 700/58 |
| 6,239,858 B1 * | 5/2001 | Tomimatu | 355/18 |
| 6,331,711 B1 * | 12/2001 | Vernon | 250/492.2 |
| 6,574,524 B2 * | 6/2003 | Kim | 700/121 |
| 6,580,962 B2 * | 6/2003 | Rapoza et al. | 700/135 |
| 6,615,112 B1 * | 9/2003 | Roos | 700/254 |
| 6,681,145 B1 * | 1/2004 | Greenwood et al. | 700/193 |
| 6,778,876 B1 * | 8/2004 | Coss et al. | 700/121 |
| 7,013,446 B2 * | 3/2006 | Ohba et al. | 716/122 |
| 7,062,354 B2 * | 6/2006 | Ganot et al. | 700/192 |
| 7,245,982 B2 * | 7/2007 | Morfino | 700/174 |
| 7,283,889 B2 * | 10/2007 | Otsuki et al. | 700/186 |
| 7,359,054 B2 * | 4/2008 | Ausschnitt et al. | 356/401 |
| 7,405,414 B2 * | 7/2008 | Sandstrom | 250/492.22 |
| 7,488,960 B2 * | 2/2009 | Zani et al. | 250/492.21 |
| 7,508,515 B2 * | 3/2009 | Hanina et al. | 356/401 |
| 7,514,273 B2 * | 4/2009 | Hedler et al. | 438/14 |
| 7,539,552 B2 * | 5/2009 | McIntyre et al. | 700/108 |
| 7,678,288 B2 * | 3/2010 | Yang et al. | 216/33 |
| 7,788,626 B2 * | 8/2010 | Nojima et al. | 716/52 |
| 7,872,745 B2 * | 1/2011 | Abe et al. | 356/237.5 |
| 7,960,074 B2 * | 6/2011 | Mickan et al. | 430/5 |
| 7,979,813 B2 * | 7/2011 | Rumsey et al. | 716/54 |
| 8,036,848 B2 * | 10/2011 | Tanamachi | 702/120 |
| 8,150,140 B2 * | 4/2012 | Kitamura et al. | 382/141 |
| 8,509,940 B2 * | 8/2013 | Gu et al. | 700/176 |
| 8,712,577 B2 * | 4/2014 | Gu et al. | 700/192 |
| 8,826,221 B2 * | 9/2014 | Scanlan et al. | 716/138 |
| 2001/0040224 A1 * | 11/2001 | Matsumoto | 250/548 |
| 2002/0035435 A1 * | 3/2002 | Ninomiya et al. | 702/35 |
| 2003/0066035 A1 * | 4/2003 | Nagamura | 716/1 |
| 2003/0086600 A1 | 5/2003 | Ganot et al. | |
| 2003/0124868 A1 | 7/2003 | Mizukoshi | |
| 2003/0158622 A1 * | 8/2003 | Corey | 700/193 |
| 2005/0105071 A1 * | 5/2005 | Ishii | G03F 7/2057 355/53 |
| 2005/0141761 A1 * | 6/2005 | Lee et al. | 382/145 |
| 2005/0186692 A1 * | 8/2005 | Olsson et al. | 438/16 |
| 2005/0213806 A1 | 9/2005 | Hanina et al. | |
| 2005/0275068 A1 * | 12/2005 | Brambilla et al. | 257/620 |
| 2006/0093963 A1 * | 5/2006 | Terahara | 430/311 |
| 2007/0003128 A1 * | 1/2007 | Anderson et al. | 382/151 |
| 2007/0076942 A1 * | 4/2007 | Yatsugake et al. | 382/141 |
| 2007/0202246 A1 * | 8/2007 | Nii | 427/9 |
| 2008/0188016 A1 * | 8/2008 | Pare et al. | 438/16 |
| 2008/0243416 A1 * | 10/2008 | Bryll | 702/95 |
| 2008/0316504 A1 * | 12/2008 | Nemets et al. | 356/614 |
| 2009/0076655 A1 * | 3/2009 | Blondel et al. | 700/254 |
| 2009/0090004 A1 * | 4/2009 | Kubota | 29/852 |
| 2010/0142838 A1 * | 6/2010 | Ivansen et al. | 382/243 |
| 2010/0191357 A1 * | 7/2010 | Maeda et al. | 700/97 |
| 2011/0155424 A1 * | 6/2011 | Noy | G06F 17/5068 174/250 |
| 2011/0196646 A1 * | 8/2011 | Mos et al. | 702/150 |
| 2011/0202896 A1 * | 8/2011 | Scanlan et al. | 716/119 |
| 2011/0257777 A1 * | 10/2011 | Wahlsten et al. | 700/103 |
| 2011/0264252 A1 * | 10/2011 | Ashizawa et al. | 700/97 |
| 2012/0062862 A1 * | 3/2012 | Wahlsten | 355/52 |
| 2012/0066898 A1 * | 3/2012 | Gustafsson et al. | 29/700 |
| 2013/0027680 A1 * | 1/2013 | Kobayashi et al. | 355/67 |
| 2013/0234019 A1 * | 9/2013 | Miyamoto et al. | 250/306 |

FOREIGN PATENT DOCUMENTS

| | | |
|---|---|---|
| JP | S63186426 A | 8/1988 |
| JP | 2003186173 A | 7/2003 |
| JP | 2004512678 A | 4/2004 |
| JP | 2006229119 A | 8/2006 |
| JP | 2007-199225 A | 8/2007 |
| WO | WO 00/46730 | 8/2000 |
| WO | WO 02/39794 | 5/2002 |
| WO | WO-03094582 A2 | 11/2003 |
| WO | WO 2006/079865 | 8/2006 |

OTHER PUBLICATIONS

Scanlan et al, "Adaptive Patterning for Panelized Packaging", Nov. 2013, pp. 6.*

International Search Report and Written Opinion mailed Jul. 8, 2011 for International Application No. PCT/EP2011/052864.

Japanese Office Action issued in corresponding Japanese Patent Application No. 2012-554361, dated Nov. 11, 2014.

* cited by examiner

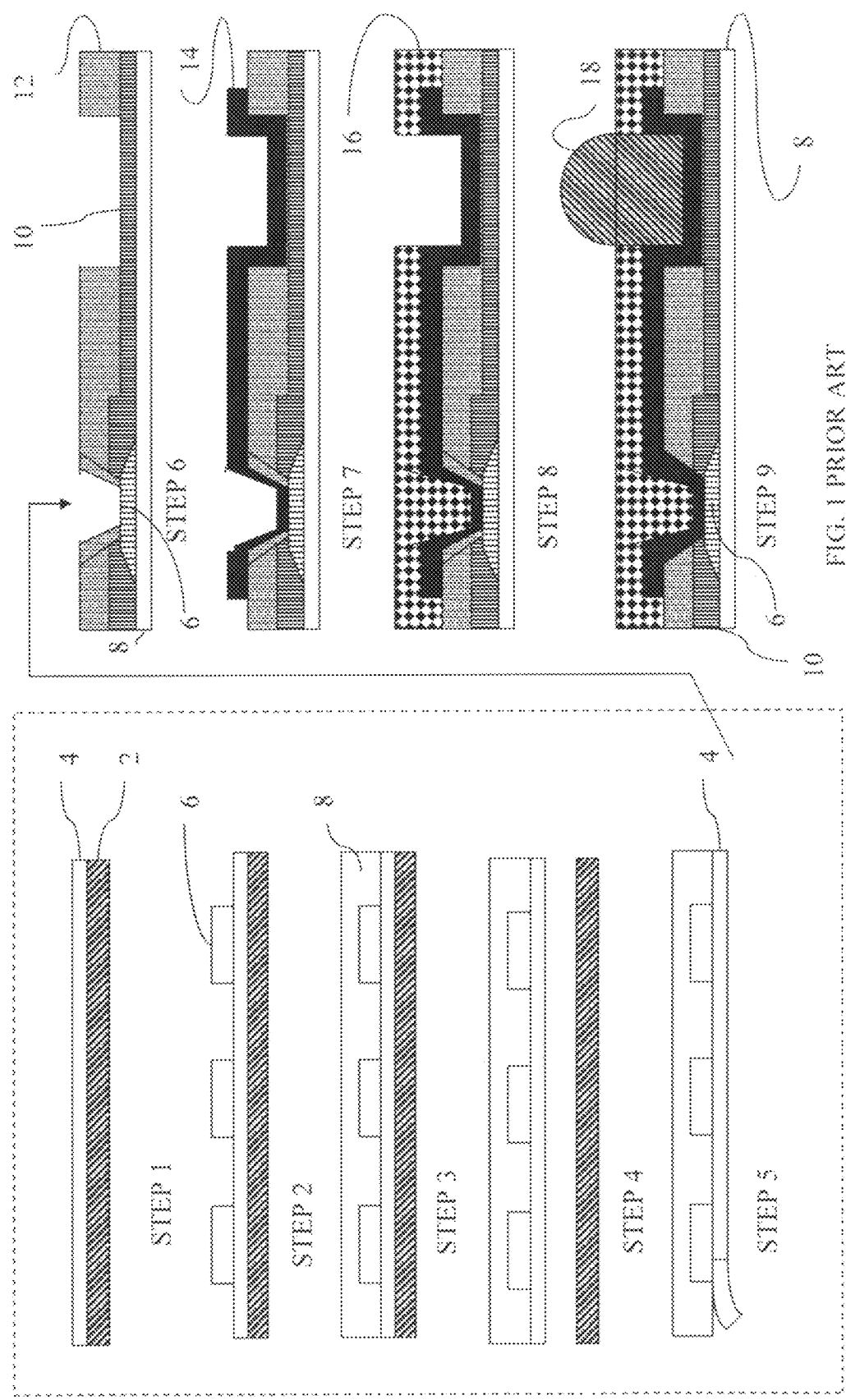

METHOD AND APPARATUS FOR PERFORMING PATTERN ALIGNMENT TO DIE

CROSS-REFERENCE TO RELATED APPLICATIONS

This non-provisional U.S. patent application claims priority under 35 U.S.C. §119(e) to provisional U.S. patent application No. 61/282,561, filed on Mar. 1, 2010, provisional U.S. patent application No. 61/282,547, filed on Feb. 26, 2010, provisional U.S. patent application No. 61/323,047, filed on Apr. 12, 2010, provisional U.S. patent application No. 61/323,048, filed on Apr. 12, 2010, and provisional U.S. patent application No. 61/323,685, filed on Apr. 13, 2010, the entire contents of all of which are incorporated herein by reference.

BACKGROUND

1. Technical Field of the Invention

The present invention relates in general to laser pattern imaging of workpieces in the manufacturing of products comprising patterning of a photosensitive surface employing a laser direct imaging device. More particularly, the present invention relates to methods and apparatuses for performing pattern alignment to components such as dies.

2. General Background of the Invention

It is common practice to manufacture printed circuit boards in a method to build a sequence of layers having different electric circuit patterns. For this purpose pattern generators using a laser direct writer as an imaging device for writing an electric circuit pattern on a substrate are well known.

General Description of Fan-Out Process

For example in the manufacturing of printed circuit boards with integrated circuits, a plurality of dies in the form of small blocks of semiconducting material each having a functional electronic circuit are distributed on a printed circuit board workpiece e.g. in the form of a carrier silicon wafer. The dies are then covered with further layers of material to form the integrated circuit in a series of manufacturing steps. In the course of the manufacturing process patterns are generated on selected layers of the workpiece in one or a plurality of patterning steps.

Pattern Generation

Patterns are generated on a layer of a workpiece, for example for the purpose of forming an electric circuit pattern generated in order to couple connection point's or contact pads of components such as dies in a desired electric circuit. The expression die is herein used as common expression for any electronic component such as a passive component, an active component, or any other component associated with electronics. Such a pattern is generated in a writing or printing process in which an image of a circuit pattern is projected, written printed on a surface layer covering a conductive layer on the workpiece.

In this context writing and printing are to be understood in a broad sense. For example, projecting, writing or printing a pattern on a surface may include exposing a photoresist or other photosensitive material, annealing by optical heating, ablating, creating any other change to the surface by an optical beam, etc.

Dependent on the used kind of photosensitive surface material, unexposed or exposed parts of the photosensitive surface layer are removed to form etching masks on the workpiece. The masked workpiece is then etched to form the desired electrical circuit pattern on the conductive layer. A variation of this concept is to use the pattern to deposit material onto the underlying layer, e.g. to form an electrical circuit pattern or connection points on the workpiece.

Pattern Generator

The pattern generator is for example realized by means of a laser direct imaging (LDI) system devised for writing a pattern on the photosensitive surface by means of a laser scanning the surface with a laser beam that is modulated according to image pattern data and forming an image representing a desired electrical circuit pattern.

Specific Background of the Invention

In recent development of manufacturing methods in this field the interest for embedded dies technologies and wafer level packaging technologies has increased due to expected advantages in cost and performance. Although these are referred to as different technologies they both involve the embedding of dies and related problems.

In this development of manufacturing integrated circuits and other products involving patterning of layers there are however various factors that affect the productivity. The placing of dies and alignment of patterns are important factors that are decisive for the overall yield in the manufacturing process using these technologies. For example, in wafer level packaging the fan-out process comprise stages that are limiting to productivity.

Alignment and Overlay Control

The printed patterns must be aligned to certain features of the workpiece, for example to the dies in order to fit to connection points in the functional electronic circuit of the respective die or to other patterns in the same or different layers of the workpiece. Overlay control is a term describing the monitoring and control of pattern-to-pattern alignment on multilayer structures.

In prior art, measuring systems comprising imagers e.g. CCD cameras, are commonly used in such alignment procedures for determining the position of a workpiece and selected features on the workpiece. For example, the cameras are employed to detect features of the workpiece such as edges or markings on the workpiece, the positions of the features in the images are used to calculate the real physical positions in relation to a reference in the pattern generator. There are different ways to compensate for the deviations of the real physical conditions from the ideal physical conditions upon which the originally designed image pattern data is assumed. For example, the image pattern data is adjusted and then the pattern is written dependent on the adjusted image pattern data. In another example, the coordinate system of the writer is adjusted to compensate and the original pattern data is written in an adjusted coordinate system.

Placing of Dies on Workpiece

Prior art patterning systems require workpieces with dies placed very accurately on the workpiece to be able to align patterns to the dies. This is due to the fact that prior art patterning systems use steppers and aligners that have limited capabilities to perform alignment to individual dies without significantly slowing down the patterning process with the consequence that current requirements on the takt time that sets the pace for the process of manufacturing products comprising patterned layers cannot be met. In prior art, the dies are accurately placed on the workpiece and fastening the dies by eutectic bonding or glue onto the workpiece, which is a very time consuming process.

Placing of Dies on Workpiece by Pick-And-Place Machine

There is a desire in the industry to distribute the dies on the workpiece by means of a pick and place machine in order to increase the production rate. However, present day pick-and-place machines cannot keep the speed required by the takt time of the manufacturing process, while maintaining the placement accuracy that is required by prior art pattern generators to manage alignment. Dies placed by means of pick-and-place machines can be regarded to have random positional errors.

Fan Out Process

The fan out process is an example of a process that includes arranging conductive paths for connecting to connection points of dies on a workpiece. A redistribution layer covering the dies is provided with a circuit pattern that is aligned with the dies and connected to contact pads e.g. with solder balls deposited on the redistribution layer and extending to an another layer in a vertical electrical connection by an aperture that in short is called a via, for vertical interconnect access between conductors in different layers. Alignment between layers is an important factor in the fan-out process and prior art conventional fan-out processes for inaccurately placed dies are not cost effective due to the poor performance of alignment to individual dies in prior art patterning systems. FIG. 1 shows schematically an example of embedded dies in a prior art process description of a fan-out wafer level packaging process. This process is further described in the detailed description below.

Prior Art

Examples of prior art pattern generators and alignment are found in the patent publications:

US 2003/0086600 Multilayer Printed Circuit Board Fabrication System and Method;

WO 03/094582 and related US2005/0213806 (A1) A System and Method for Manufacturing Printed Circuit Boards Employing Non-uniformly Modified Images.

These pieces of prior art describe the general functionality of pattern generators in the form of laser direct imaging systems adapted to write an electric circuit pattern on a printed circuit board dependent on pattern image data. These publications further describe prior art for alignment of patterns on substrates.

Difficulties in Prior Art

FIG. 2 shows an example of dies 202 placed on a workpiece in the form of a wafer 200 in a general order on a global level but in a non-systematic order on a local level. In summary, in order to increase production rate die placement must be allowed to be less accurate and even non-systematic as in FIG. 2. However, random positional errors for a die make it relatively difficult to achieve desired overlay performance with conventional aligners. In prior art, EGA alignment (Enhanced Global Alignment) capability allows conventional stepper technology to increase exposure rate in packaging of devices with relatively tight design rules. In this case such steppers expose the same transform of pattern for several dies in the assumption that they fit to the same transform. Alternatively, the same pattern is exposed for such a low number of dies that the probability of excessively large deviations from specification is avoided.

FIG. 3 shows a conventional prior art printing method that seeks to deal with the local alignment problem, here aligning to individual dies 300 in a group of two dies. As shown in FIG. 3, the exposure regions are divided into small areas down to each die. In A. 1×1 field with 2 drop-in die which in this example requires 390 exposure shots/wafer; in B. 2×2 filed overprinting at edge and requiring 103 shots/wafer; and in C. 5×3 field overprinting at edge 34 shots/wafer. The exposure is in this prior art method performed by steppers. However, this conventional approach has a relatively large takt penalty because realigning for each shot is necessary.

Problem

The general object of the invention is to improve the fan out process cost efficiency for 2D/3D embedded dies. A more specific problem to be solved by the invention is to achieve efficient alignment of a pattern to individual dies on a workpiece while enabling margins for inaccuracy in the placement of the dies.

SUMMARY

The general object is achieved and the problem is solved by providing a method and/or an apparatus and/or a computer program product according to the appended claims.

The invention is applicable to laser pattern imaging of workpieces in the manufacturing of products comprising the patterning of a surface employing a laser direct imaging device. For example, patterning by projecting, writing or printing a pattern on a surface may include exposing a photoresist or other photosensitive material, annealing by optical heating, ablating, creating any other change to the surface by an optical beam, etc.

Examples of such products are printed circuit boards PCB, substrates, flexible roll substrate, flexible displays, wafer level packages WLP, flexible electronics, solar panels and display. The invention is directed to patterning such a photosensitive surface on a workpiece for such products with dies in a direct write machine, where a workpiece can be any carrier of a surface layer upon which a pattern can be printed with a laser direct imaging system.

The more specific problem as stated above is solved by preparing an adjusted circuit pattern data for writing on the workpiece that is dependent both on the original pattern data and on transformed positions of dies that are distributed on the workpiece. By this solution the invention enables pattern alignment to dies allowing low accuracy or even arbitrary placement of dies on the workpiece.

BRIEF DESCRIPTION OF DRAWINGS

The invention will be further explained with reference to the accompanying drawings wherein:

FIG. 1 shows schematically an example of embedded dies in a prior art process description of a fan-out wafer level packaging process.

DETAILED DESCRIPTION

Figures 2, 4:
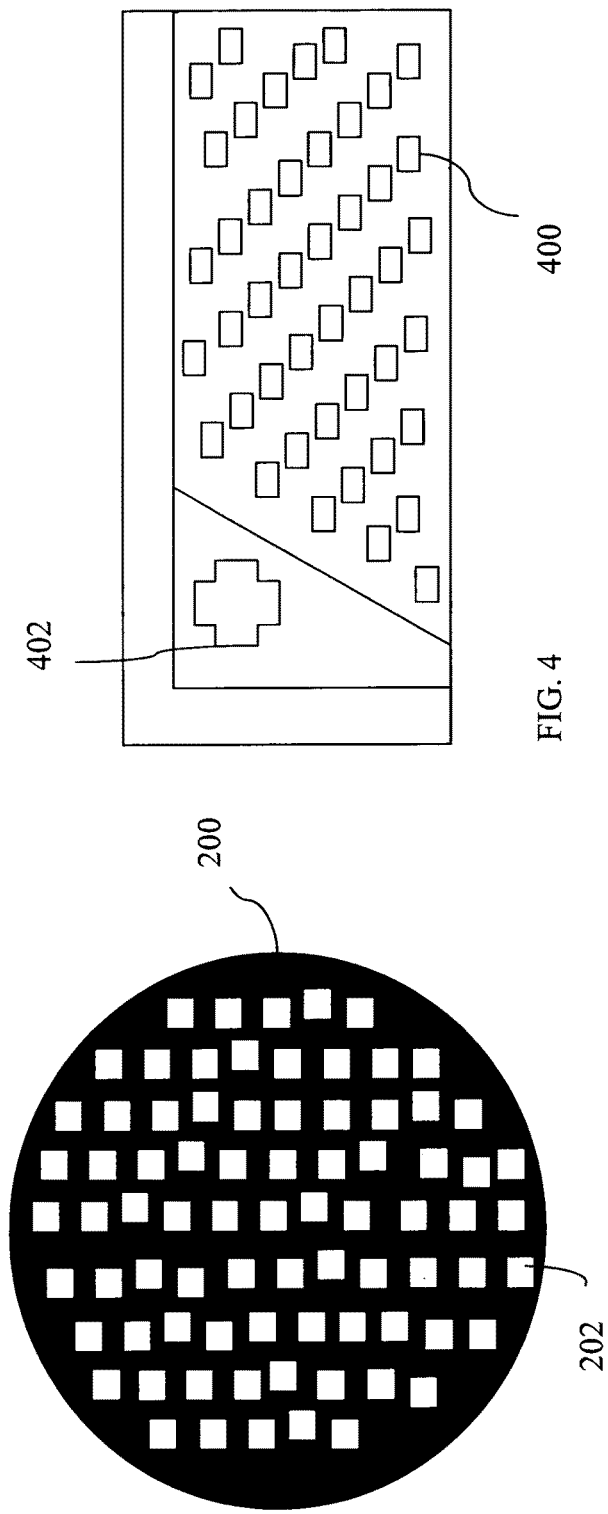
FIG. 2 shows schematically an example of a workpiece with dies distributed thereon.
FIG. 4 shows schematically an example of an alignment mark on a die.
Figure 3:
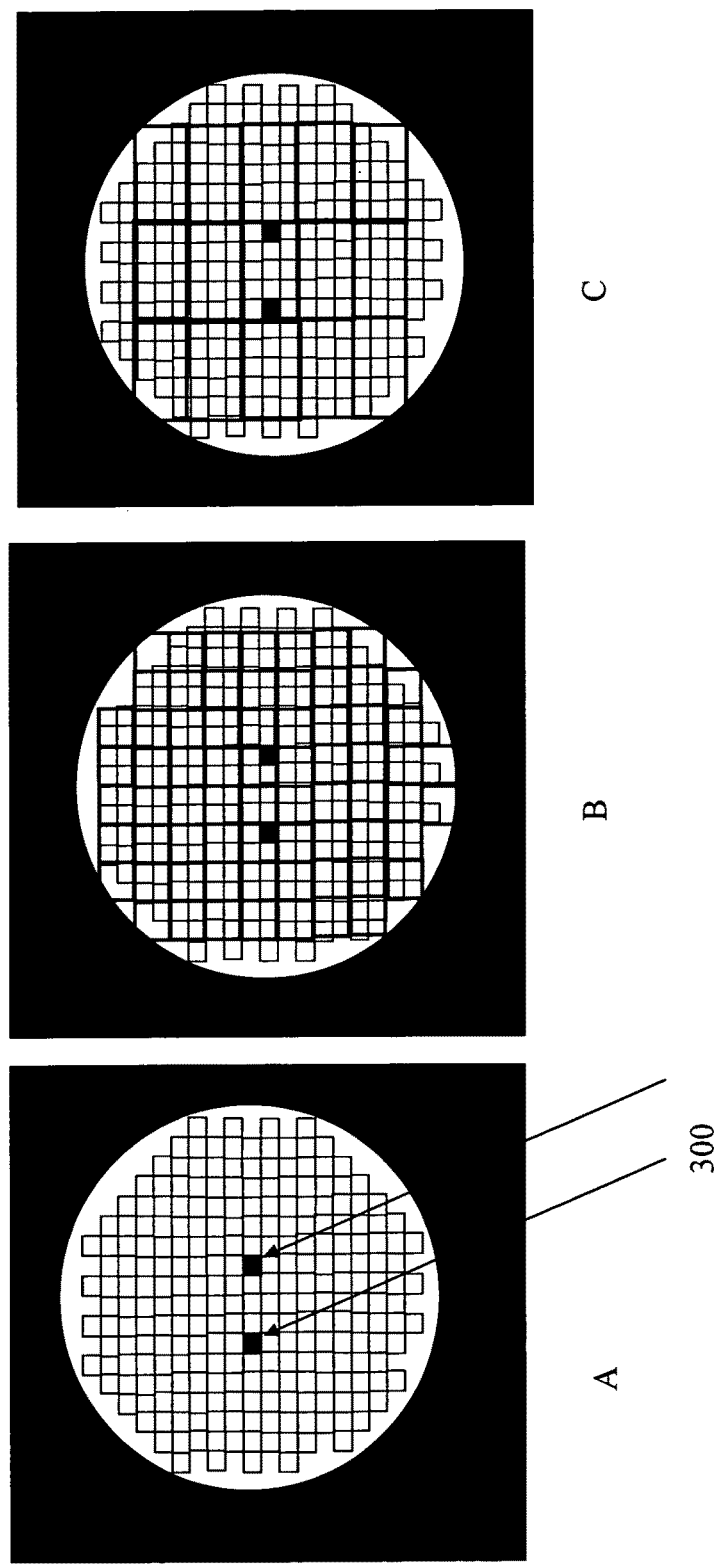
FIG. 3 shows schematically an example of a prior art method for aligning to individual dies or to a group of dies.

Explanations of Terminology and Embodiments
Used in this Text

Workpiece

For the purpose of this application text the term workpiece is used to denominate any carrier of a surface layer upon which a pattern can be printed with a laser direct imaging system. For example a silicon substrate or a silicon wafer for a printed circuit board workpiece, or an organic substrate. Workpieces may have any shape, such as circular, rectangular or polygonal, and may have any size for example in a piece or in a roll.

Die

For the purpose of this application text the term die is used to denominate a passive component, an active component, or any other component associated with electronics. For example, a die may be a small block of semiconducting material, on which a given functional circuit is fabricated.

Local Alignment

For the purpose of this application text the term local alignment is used to denominate alignment in relation to alignment features, for example alignment marks, on an individual die or on a group of dies.

Global Alignment

For the purpose of this application text the term global alignment is used to denominate alignment in relation to alignment features, for example alignment marks, on a workpiece.

Various Explanations

In the drawings, the thicknesses of layers and regions are exaggerated for clarity. Like numbers refer to like elements throughout the description of the figures.

Detailed illustrative embodiments are disclosed herein. However, specific structural and functional details disclosed herein are merely representative for purposes of describing example embodiments. Example embodiments may be embodied in many alternate forms and should not be construed as limited to only the example embodiments set forth herein.

It should be understood, however, that there is no intent to limit example embodiments to the particular ones disclosed, but on the contrary example embodiments are to cover all modifications, equivalents, and alternatives falling within the appropriate scope.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or," includes any and all combinations of one or more of the associated listed items.

It will be understood that when an element is referred to as being "connected," or "coupled," to another element, it can be directly connected or coupled to the other element or intervening elements may be present. In contrast, when an element is referred to as being "directly connected," or "directly coupled," to another element, there are no intervening elements present. Other words used to describe the relationship between elements should be interpreted in a like fashion (e.g., "between," versus "directly between," "adjacent," versus "directly adjacent," etc.).

The terminology used herein is for the purpose of describing particular embodiments only and is not intended to be limiting of example embodiments. As used herein, the singular forms "a," "an," and "the," are intended to include the plural forms as well, unless the context clearly indicates otherwise. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Example embodiments relate to scanning of workpieces, such as a substrate or wafer, for reading and writing patterns and/or images. Example embodiments also relate to measuring workpieces. Example substrates or wafers include flat panel displays, printed circuit boards (PCBs), flexible printed circuit boards (FPBs), flexible electronics, printed electronics, substrates or workpieces for packaging applications, photovoltaic panels, and the like.

According to example embodiments, reading and writing are to be understood in a broad sense. For example, reading operations may include microscopy, inspection, metrology, spectroscopy, interferometry, scatterometry, etc. of a relatively small or relatively large workpiece. Writing may include exposing a photoresist or other photosensitive material, annealing by optical heating, ablating, creating any other change to the surface by an optical beam, etc.

DETAILED DESCRIPTION OF EMBODIMENTS

The invention is embodied in methods, apparatus and computer program products for patterning a workpiece.

The more specific problem as stated above is solved by preparing an adjusted circuit pattern data for writing on the workpiece that is dependent both on the original pattern data and on transformed positions of dies that are distributed on the workpiece. By this solution the invention enables pattern alignment to dies allowing low accuracy or even arbitrary placement of dies on the workpiece.

The direct write machine is provided with a coordinate system for controlling write operations and the workpiece is having dies distributed thereon, wherein dies distributed on the workpiece are being associated with a circuit pattern in the form of original circuit pattern data.

A computer system is devised to receiving measurement data being associated with the workpiece and indicating a measured position of a plurality of the dies, or group of dies, distributed on the workpiece in relation to at least one reference feature of the workpiece. In order to relate to the workpiece, there are further steps of detecting the at least one reference feature of the workpiece, and determining the relation between the at least one reference feature of the workpiece and the coordinate system of the direct write machine.

A transformation operation is configured to transforming the measured position of the plurality of dies, or group of dies, distributed on the workpiece to a transformed position defined in the coordinate system of the direct write machine dependent on the determined relation between the at least one reference feature of the workpiece and the coordinate system of the direct write machine. Thereafter, adjusted circuit pattern data for writing on the workpiece is prepared dependent both on the original pattern data and the transformed positions, wherein the adjusted circuit pattern data represents the circuit pattern of the plurality of dies, or group of dies, such that the adjusted circuit pattern is fitted to at least a portion of the workpiece area. Then a pattern is written on the workpiece according to the adjusted circuit pattern data.

Operating Environment of the Invention

The invention is typically employed in a scanning laser direct imaging (LDI) system comprising for example a laser direct writer as described in the above mentioned prior art publication US 2003/0086600, which is hereby incorporated by reference as an example of such a machine that may be used for the implementation of embodiments of the invention. In such a system a laser beam is scanned over a photosensitive surface layer of a workpiece to expose the layer with a pattern in accordance with pattern image data. Different embodiments of the invention may include patterning equipment for example for patterning by projecting, writing or printing a pattern on a surface that may include exposing a photoresist or other photosensitive material, annealing by optical heating, ablating, creating any other change to the surface by an optical beam, etc.

The system preferably comprises a computer adapted to control the patterning, e.g. laser beam scanning, dependent inter alia on image pattern data that may be adjusted, compensated or transformed. The system further comprises or is coupled to a computerized measuring system, typically having CCD cameras and recognition software devised to recognize objects such as dies or features such as alignment marks on a workpiece. Measurement data from the measuring system is used in an alignment system to adapt original image pattern data in order to compensate for deviations in the workpiece from assumed conditions. When implementing the invention a computer is provided with specifically designed computer programs adapted to perform steps of the inventive method.

The invention is devised to operate on a workpiece, for example a silicon substrate, an organic substrate or a wafer, that is provided with dies distributed and placed with an arbitrary position on the workpiece. The positions of the dies are defined in a three-dimensional coordinate system and thus indicate location and orientation. For example, the dies may have been placed on the workpiece by means of a pick-and-place machine, resulting in a workpiece with low position accuracy of the dies. The dies shall typically be aligned with a circuit pattern to be printed on a surface layer such that the circuit pattern can be connected to connection points of the dies, for example in a fan-out process. Preferred embodiments are implemented in or in conjunction with a direct write machine and alignment system.

Example of Fan-Out Process

FIG. 1 shows schematically an example of embedded dies in a prior art process description of a fan-out wafer level packaging process. Such a conventional FAN-out process, here exemplified with a prior art fan-out wafer level packaging known to be provided by Infineon (Source: Infineon), typically comprises the following steps:

Step 1: A laminate carrier, for example a carrier wafer, is provided and arranged to receive dies on an adhesive tape.

Step 2: A plurality of dies (of one or several types) are placed on the carrier by means of a pick and place machine.

Step 3: Compression moulding over the dies and the adhesive tape to fixate the dies in a moulded carrier wafer.

Step 4: Separating the carrier from the adhesive tape and the moulded carrier wafer.

Step 5: Removing, for example by pealing, adhesive tape from the moulded wafer to create a reconstituted wafer.

After placing the dies on the moulded carrier wafer, one or more patterning steps are performed on the wafer, for example a selection of:

Step 6: Deposition and patterning of dielectric, possibly a multiple of this step.

Step 7: Metallization and patterning.

Step 8: Deposition and patterning of dielectric.

Step 9: Solder bump deposition to achieve electric connection for external terminals to contact pads coupled to connection points of dies.

An embodiment of the present invention is adapted to be applied for alignment in the patterning steps in this kind of fan-out process in order to improve cost efficiency.

Workpiece with Arbitrarily Placed Dies

As briefly mentioned in the background section FIG. 2 shows schematically an example of a workpiece 200 with a plurality of dies 202 distributed thereon, in this example a reconstituted wafer in an eWLB packaging structure, where eWLB is an abbreviation for embedded Wafer Level Ball Grid Array. As shown in FIG. 2, conventionally, die placement is non-systematic, and a printed field, i.e. a field of printed circuit pattern will have different registration errors in relation to different dies and in practice a workpiece produced like this will have random positional errors. The invention is adapted to enable local alignment of patterns to embedded dies for example in this kind of workpiece.

Figure 8:
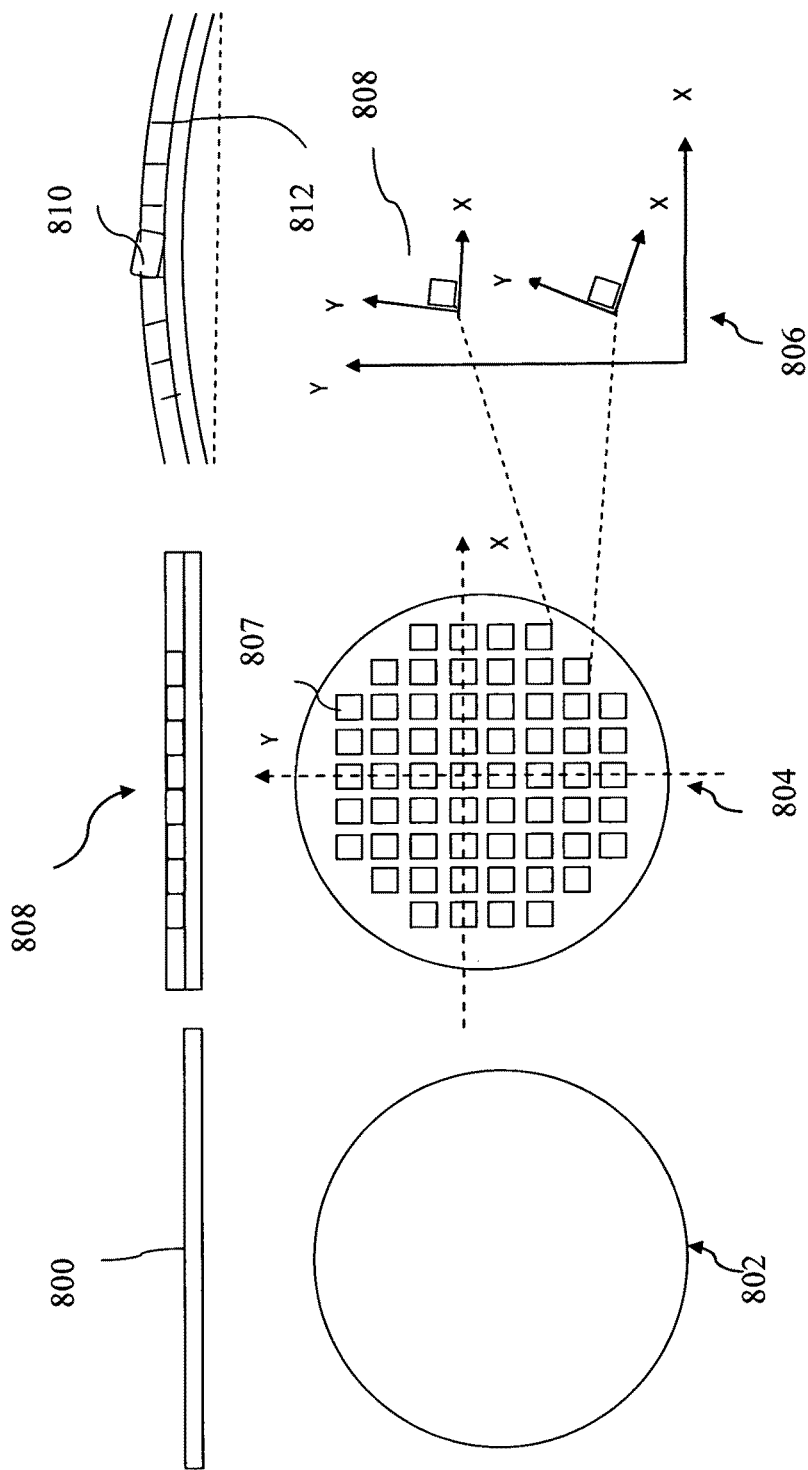
FIG. 8 shows schematically an example of a workpiece with dies distributed thereon, illustrating the local and global location and orientation of dies dependent on the shape of the workpiece.

The workpiece that the invention is intended to operate on has a plurality of dies distributed thereon. It is assumed that the dies are distributed and positioned arbitrarily or randomly on the workpiece, although the dies would normally be placed in a general global order on the workpiece. The positions of the dies would also normally be affected by the shape and shape deviations of the workpiece. FIG. 8 shows an example of a workpiece in the form of a wafer with the local and global location and orientation of dies thereon. To the left there is an original workpiece, in the form of a wafer, from a top view 802 and a side view 800. In the middle there is shown a top view 804 and a side view 808 of a wafer with dies 807 distributed thereon generally ordered and located in rows. To the right there is an illustration of the position of dies 807 in a 2-dimensional global coordinate system 806 and the orientation of individual dies 807 in local 3-dimensional coordinate systems (x,y theta) 808 thus belonging to each individual die. The position of each die may include translation, rotation, warpage, etc. To the right there is also a side view of the workpiece showing global warpage 812 of the wafer and local warpage 810 of the dies.

Embodiments of Method for Patterning a Workpiece

In one variety the invention is embodied in a method for patterning a workpiece for example in a direct write machine. The workpiece has one or a plurality of dies distributed thereon. The direct write machine is provided with a coordinate system for controlling write operations in a per se known manner.

Figure 5B:
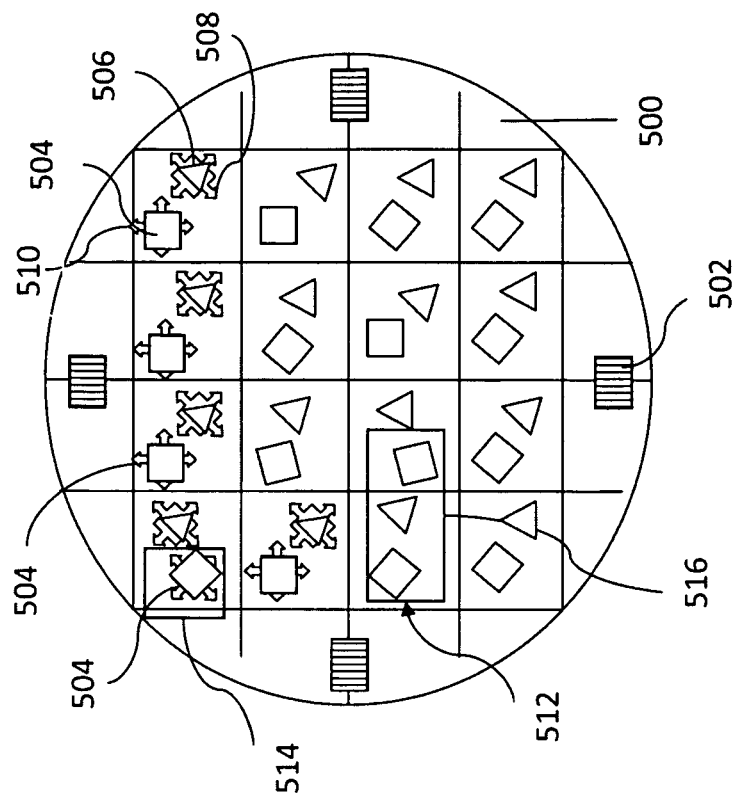
FIG. 5A-B show schematically an example of local pattern adaptation to individual dies in accordance with an embodiment the invention.
Figure 5A:
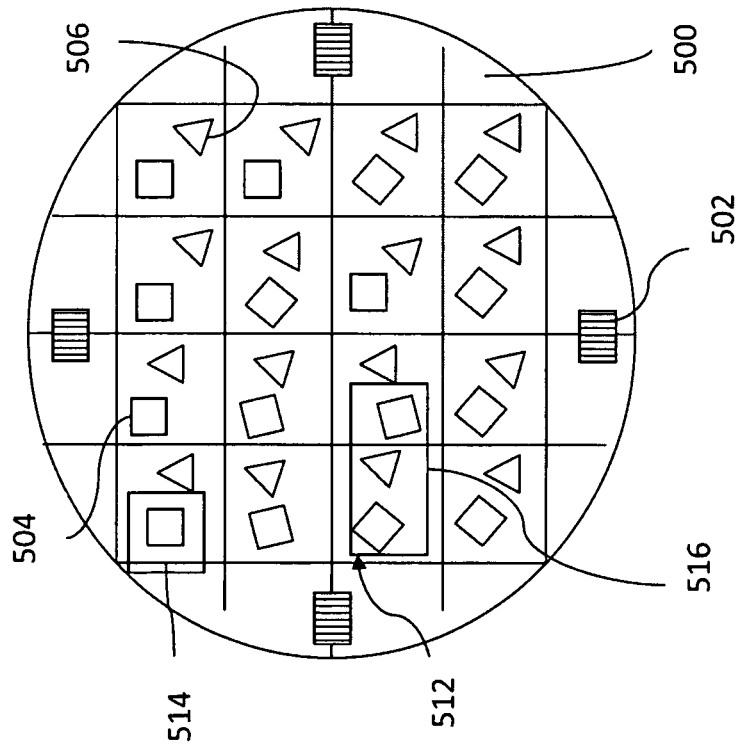

Each die is associated with a circuit pattern in the form of original circuit pattern data. This is illustrated in FIG. 5A and FIG. 5B, which show schematically an example of local pattern adaptation to individual dies on a workpiece in accordance with an embodiment the invention. In FIG. 5A, a workpiece 500 having global reference marks, for example alignment marks, is provided with a plurality of arbitrarily placed dies of two different types, die type 1 504 and die type 2 506. FIG. 4 shows schematically a per se known example of a reference mark 402 in the form of an alignment mark on a die 400, in this example the alignment mark is a bright cross

402. The different die types are to be aligned with different pattern types, pattern type 1 508 and pattern type 2 510. FIG. 5B illustrates that the pattern type 1 508 has been aligned with and printed on a layer over die type 2 506, and that the pattern type 2 510 similarly has been aligned with and printed on a layer over die type 1 504. Further, multiple dies of the same type may have a different type of pattern. In FIG. 5B, the rotation of the pattern has been adjusted to each die (cell). In this connection, a die or a group 512 of dies may be called a cell. It is also possible to have an adjustment for each die (cell) or an adjustment for a group 512 of dies (cells), for example, the same rotation and translation for 3×3 cells.

The workpiece is preferably divided into sub-areas, for example sub-area 514 which is associated with a die 504 that in the exemplifying illustration in FIG. 5B is aligned with pattern 510. A sub-area 516 may also be associated with a group 512 of dies.

Figure 6:
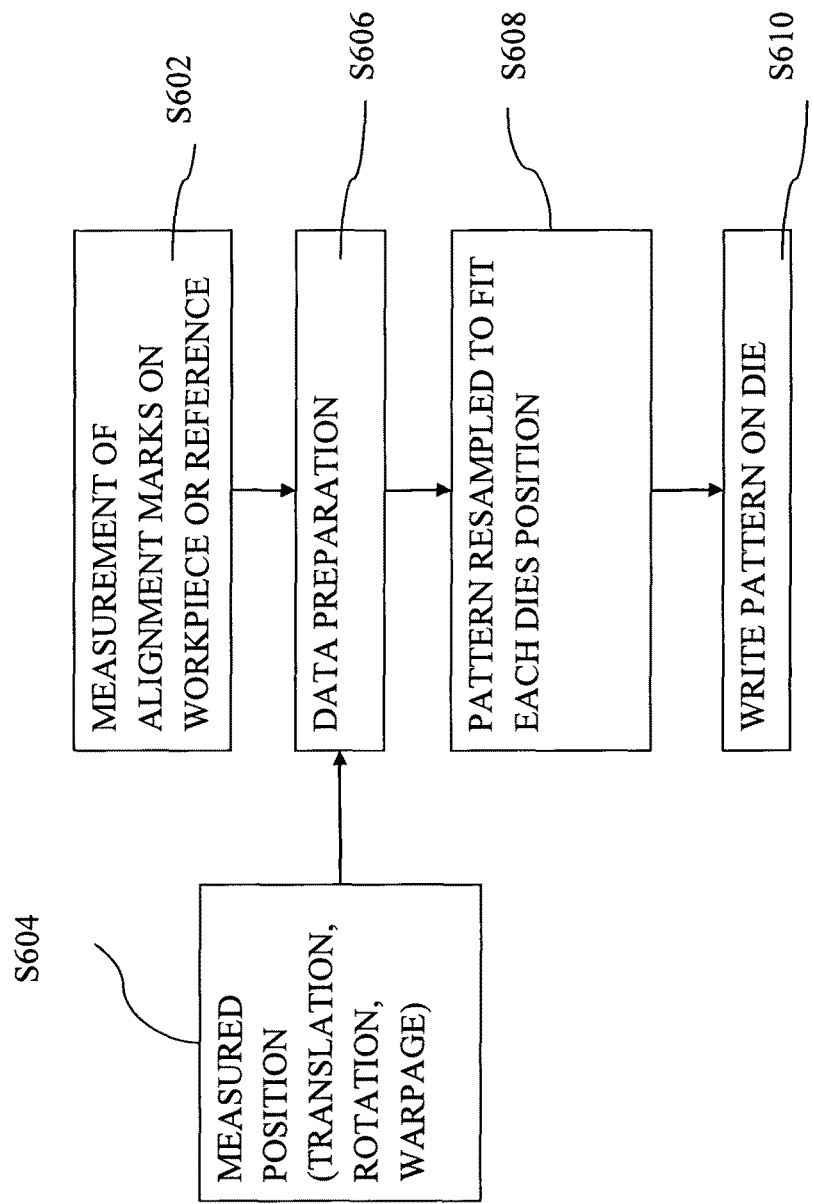
FIG. 6 shows a flow diagram of a method according to an embodiment of the invention.

FIG. 6 shows in a schematic flow diagram an exemplifying embodiment a method for patterning a workpiece. The method shown in FIG. 6 may be implemented in a direct write machine, for example.

Referring to the steps in FIG. 6, this embodiment comprises:

At S602: Alignment marks on a workpiece, for example a wafer, or on a reference die are measured.

At S604: A position of one or more die(s) on the workpiece (e.g. wafer) is measured. As mentioned above, the position of each die may include translation, rotation, warpage, etc. The position of each die may be measured in the same machine comprising the direct write machine, or in an external measurement machine. Steps S602 and S604 may be performed in the reversed order.

If the position of a die is measured in an external measurement machine, the position of the die is relative to some global reference marks on the carrier wafer or a given reference die. If the measurements are performed in the direct write machine, the same principle may be used or the measurements may be used directly in the machine. The position of each die is defined in the coordinate system of the writer by measuring the reference marks and transforming the position and rotation of each die to the coordinate system of the machine. Alternatively, the predefined reference die(s) may be used in the same manner.

Further, according to at least some example embodiments, each die may have alignment marks for measurement. Alternatively, each die may be measured with some shape-based measurement algorithm capable of measuring the absolute and/or relative position of the die without alignment marks, for example, by measuring the shape of the die, the microscopic non-uniformities and/or characteristics that are inherent to a surface of the die and using these measurements for determining the absolute and/or relative position of the die. At least one camera (e.g., a CCD camera or the like) may be used for measuring the shape, features, and/or microscopic non-uniformities of dies or the global workpiece in order to determine the absolute and/or relative position of the dies. The shape and/or position of the die may also be measured using at least one sensor (e.g., a physical sensor or the like). According to certain example embodiments, the position of each die may be measured on the frontside (e.g., the writing side) of the workpiece and/or on the underside (e.g., the backside opposite to the writing side) of the workpiece in combination with (or alternatively without) using alignment marks, where the measured shape and/or microscopic non-uniformities of the frontside or underside of a workpiece is used as a reference position for determining the absolute and/or relative position of a die in or on the workpiece.

As mentioned above, the position of the dies may be determined by measuring microscopic non-uniformities, features or a shape of the global workpiece (e.g., a corner of the workpiece) that is also measurable in the writer where the measured shape, features and/or microscopic non-uniformities of the frontside or underside of the workpiece is used as a position reference for determining the absolute and/or relative position of the dies.

At S606: Pattern data is prepared based on the measured alignment marks and position of each die.

At S608: The pattern to be written is re-sampled to fit the position of each die. In one example, the pattern is re-sampled from original pattern data to fit each die. In another embodiment, the pattern is rasterized from vector data that have been translated or transformed to fit each die. In an alternative embodiment also mentioned below, the coordinate system of the writing tool is transformed in a corresponding manner to fit the original pattern to the positions of the dies, and then the original pattern is written by the transformed coordinate system.

According to example embodiments, different dies may have different types of patterns. As shown in FIG. 5 and explained above, there can be several types of dies, and thus, different types of patterns on the same wafer. FIG. 5 is an illustration of how a pattern may be adapted to the position of a die in these stages of FIG. 6.

At S610: a pattern is written on the wafer, the pattern thus being adjusted to fit each die.

Figure 9A:
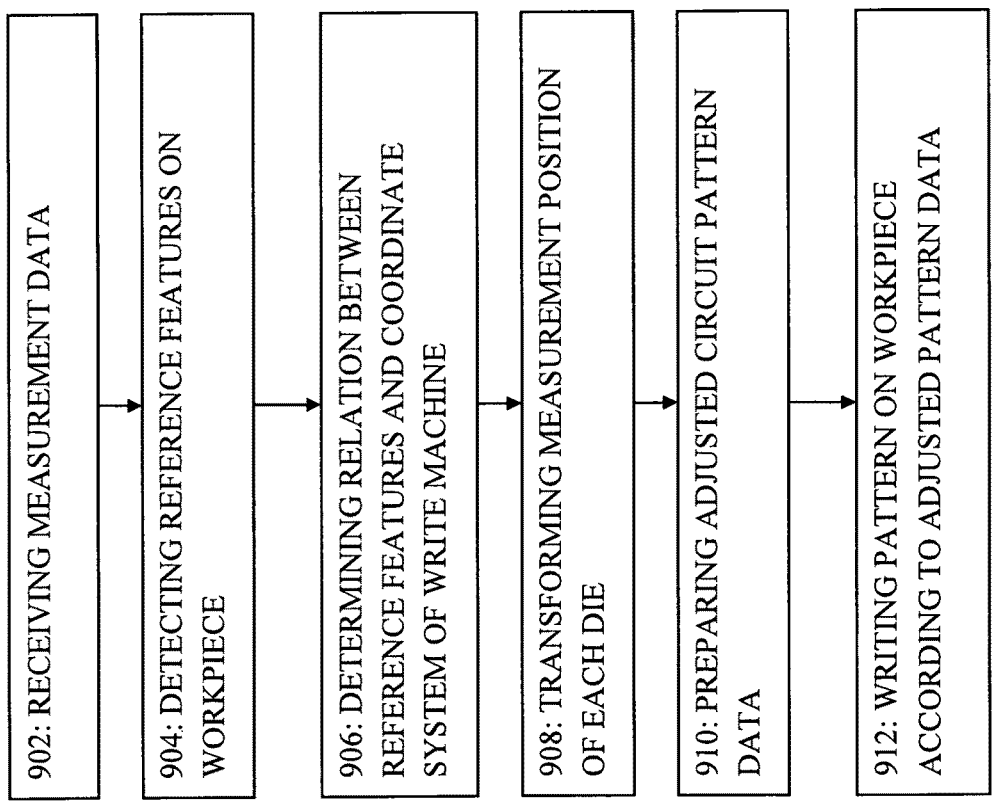
FIG. 9A shows a flow diagram of a method of alignment of pattern to dies according to an embodiment of the invention.

FIG. 9A illustrates schematically further embodiments of a method for patterning a workpiece for example in a direct write machine. The workpiece has a plurality of dies distributed thereon, where the dies are a selection of a passive component, an active component, or any other component associated with electronics. The direct write machine is provided with a coordinate system for controlling write operations in a per se known manner and the method comprises the following steps:

902: Receiving measurement data being associated with the workpiece and indicating a measured position of a plurality of the dies, or group of dies, distributed on the workpiece in relation to at least one reference feature of the workpiece. The measurement data is typically determined by determining a reference feature of the workpiece, and then measuring the position of the die in relation to the reference feature.

In different embodiments further described below, the measurement data file may comprise a list of transformations and areas they cover, alternatively a measurement file with data that describes the transformation in a given point. Measurements on dies have been analyzed in a step before the writer and a high resolution map that describes the local alignment areas and their values is used in the writer.

The position of the dies, or group of dies, is preferably determined in terms of the location and the orientation of the dies on the workpiece in relation to least one reference; and/or the spatial location and orientation of the dies, or group of dies, in a space comprising the workpiece in relation to the reference. In a different wording and as explained above, the position may be indicated as position or location in a 2-dimensional global coordinate system of the workpiece and the orientation of individual dies in a local 3-dimensional coordinate systems (x,y theta) thus belonging to each individual die.

A reference feature of a die is for example determined by a selection of: one or several alignment mark(s) provided on the die; or a characteristic of the surface structure of the die(s); or a characteristic of the shape of the die, such as an edge or a corner of the die.

As explained above, the measuring of the position of a die is for example determined by a selection of:

a. Determining the spatial position of the die in relation to the reference feature by means of a selection of a shape based position determining algorithm, an edge detection based algorithm, a correlation based algorithm or another image analysis techniques devised for extracting a position from a reference feature; or b. Determining the spatial position of the die in relation to the reference feature with one or several alignment mark(s) on the die; or c. Determining the spatial position of the die in relation to the reference feature by a characteristic of the surface structure of the die.

The measurement data may be determined to indicate the position of the dies or of a group or cluster of dies on the workpiece. The measurement data may optionally be determined in a separate measurement machine or in a measurement arrangement that is integrated with or integrated in the direct write machine. The measurement data is preferably received in a computer adapted to manipulate image pattern data and/or to control the writing laser beam of the direct write machine.

Further, the measurement data is optionally determined by determining a reference feature of the workpiece and/or by measuring the position of a group of dies in relation to said reference feature. The measurement data may not necessarily comprise measurement value for every single die. As mentioned, it is also possible to include measurement values for clusters of for example 2×2 dies, 4×4 dies. The measurement value of a cluster may for example indicate an average deviation from a nominal position.

The reference feature of a die is for example determined by a selection or a combination of: one or several alignment mark(s) provided on the die; or a characteristic of the surface structure of the die(s); or a characteristic of the shape of the die, such as an edge or a corner of the die, or by measurement on the writing side or on the backside of the workpiece.

904: Detecting the at least one reference feature of the workpiece, preferably by detecting means in the form of a measurement system.

The reference features of the workpiece may be detected in a similar manner as for the detection of reference features for dies as explained above, i.e. for example by means of alignment marks on the workpiece, by shape or by other characteristic features on the workpiece or among the dies. In exemplifying embodiments, the at least one reference feature of the workpiece is determined by a selection or a combination of: one or several alignment mark(s) provided on the workpiece; or one or several reference feature(s) provided on one or a plurality of reference die(s) selected among the plurality of dies; or a characteristic of the arrangement of the dies distributed on the workpiece; or a characteristic of the surface structure of the workpiece; or a characteristic of the surface structure of the die(s); or one or several reference die(s); or a characteristic of the shape of the workpiece, such as an edge or a corner of the workpiece; or by measurement on the writing side or on the backside of the workpiece.

906: Determining the relation between the at least one reference feature of the workpiece and the coordinate system of the direct write machine. The relation may optionally be measured or be assumed or be a pre-settable parameter.

The relation that defines how dies are positioned in the direct write machine comprises using a selection of but preferably all of: the position of dies, the position of the workpiece and the position of the coordinate system of the direct write machine.

908: Transforming the measured position of the plurality of dies, or group of dies, distributed on the workpiece to a transformed position defined in the coordinate system of the direct write machine dependent on the determined relation between the at least one reference feature of the workpiece and the coordinate system of the direct write machine.

Typically, all dies are described by a first transformation in relation to the workpiece, then the workpiece is described by a transformation in relation to the coordinate system of the writer.

The transformation may further comprise a transformation of the position and shape of the workpiece to being defined in the writer coordinate system. This is true when the workpiece in the measurement stage has been found to have a transformation that deviates from the ideal transformation. In such a case, measurement data for every die is compensated with the transformation that defines the position of the workpiece in the measurement machine based on the reference position used in the writer, which normally would be nominal positions. Thus, in order to avoid that the different transformations of the workpiece in the measurement machine and in the writer, respectively, shall affect the end result.

Determining a Transformation

The transformation to be applied is determined in a variety of ways, for example dependent on the characteristics of the workpiece and/or the dies distributed thereon.

In one embodiment, the positions of the dies, or group of dies, in terms of both location and orientation on the workpiece together with location and orientation of the workpiece relative the writer coordinate system is used to determine a transformation of the measured positions defined in the coordinate system of the direct write machine.

910: Preparing adjusted circuit pattern data for writing on the workpiece dependent both on the original pattern data and the transformed positions, wherein the adjusted circuit pattern data represents the circuit pattern of the plurality of dies, or group of dies such that the adjusted circuit pattern is fitted to at least a portion of the workpiece area.

Sub-Areas

The adjusted circuit pattern data is in embodiments further rendered such that the adjusted circuit pattern is fitted to a plurality of sub-areas of the workpiece area, possibly wherein each sub-area is associated with a die, or group of dies, among the plurality of dies distributed on the workpiece. Further, the adjusted circuit pattern data may be rendered to be fitted to the plurality of dies, or group of dies, in a way such that the sub-portions of the adjusted pattern data each represents a sub-area of the workpiece associated with a particular die, or group of dies, and where each of said sub-areas includes, or covers, said particular die, or group of dies.

The workpiece may be divided into sub-areas in different ways. In one embodiment, at least a portion of the workpiece area is divided into sub-areas that each are to be represented by sub-portions of the adjusted pattern data, and wherein the sub-areas are identified by the received measurement data and/or the workpiece area is divided into sub-areas by the use of a pre-determined algorithm. In another embodiment, the sub-areas are automatically identified by the received measurement data and/or the workpiece area is automatically divided into sub-areas by the use of the pre-determined algorithm. Further, a plurality of said sub-portions of the adjusted pattern data may be rendered to fit to respective sub-area within certain requirements and/or at least one pre-settable deviation parameter.

For the purpose of preparing adjusted circuit pattern data the measurement may in one embodiment comprise defining a re-sampling map for the whole pattern.

In one embodiment, the preparing of adjusted circuit pattern data comprises transforming the original pattern data in the form of vector data to fit each die, or group of dies, and rasterizing said transformed vector data such that the rasterized vector data represents the whole workpiece having all of the dies distributed thereon.

In another embodiment, the preparing of adjusted circuit pattern data comprises in one embodiment rendering the original pattern data from a set of ideal pattern data. An ideal pattern is in this context the layout and the position of the pattern in the nominal coordinate system, usually a CAD system or similar. Then there is a step of re-sampling the original pattern data dependent on the measured position data of the die(s) and on the transformed position and shape of the workpiece in order to fit data to each die on the workpiece in the coordinate system of the direct write machine. Optionally, there is a step of re-sampling the original pattern data dependent on measured position data of a group or a cluster of the dies and on the transformed position and shape of the workpiece in order to fit data to each group or cluster on the workpiece in the coordinate system of the direct write machine.

Preferably, the adjusted circuit pattern data represents the whole workpiece having all of the dies distributed thereon Requirements and/or Deviation Parameter The fitting of the adjusted circuit pattern is carried out in different optional manners.

For example, a plurality of said sub-portions of the adjusted pattern data are rendered to fit to respective sub-area within certain requirements or one or more pre-settable deviation parameters. The certain requirement or pre-settable deviation parameters are, in different embodiments, associated with at least one of: a. type of die, component, or group of dies/components; or b. a characteristic of the surface structure of the die(s)/component(s); or c. a characteristic of the shape of the die(s)/component(s), such as an edge or a corner of the die(s)/component(s).

In one embodiment, the whole adjusted circuit pattern data is fitted to the plurality of dies, or group of dies, on the workpiece within a pre-settable deviation parameter or set of deviation parameters. The deviation parameter can be defined in different ways, for example with a pre-settable: value, minimum threshold value, maximum threshold value, interval of values or selectable formula for calculating the deviation parameter.

The pre-settable deviation parameters may include both parameter(s) associated with location and parameter(s) associated with orientation.

For example, in one embodiment the deviation parameter is the residual error of the placement or position of the adjusted circuit pattern in relation to the dies is in the range of or less than 100 micrometers (μm). In other embodiment the residual error is in the range of or less than 10 micrometers (μm), in the range of or less than 5 micrometers (μm), or probably most frequently in the range of or less than 1 micrometer (μm). Thus, in different embodiments, the adjusted circuit pattern data is fitted to the plurality of dies, or group of dies, on the workpiece within a the pre-settable deviation parameter that is set to less than 100 μm or less than 10 μm or less than 5 μm or less than 1 μm, for at least some of the dies, or group of dies, distributed on the workpiece.

A deviation from a perfect fitting or match occurs for example if there are a plurality of transformations that must coexist simultaneously in the same area, in this context called a transition zone. In another example, a deviation occurs when the required transformation is a more complex transform than that or those available to apply.

The adjusted circuit pattern data associated with a particular die, or group of dies, is for example fitted individually to said particular die, or group of dies. Preferably, the plurality of dies, or group of dies, includes all of the dies distributed on the workpiece. In one embodiment, the circuit pattern data associated with at least one of the dies, or group of dies, on the workpiece is adjusted individually and independently of circuit pattern data associated with the other dies on the workpiece. In another embodiment, the circuit pattern data associated with each of the dies, or group of dies, on the workpiece is adjusted individually and independently of circuit pattern data associated with any of the other dies on the workpiece.

The preparing of adjusted circuit pattern data comprises in one embodiment rendering the original pattern data from a set of ideal pattern data. An ideal pattern is in this context the layout and the position of the pattern in the nominal coordinate system, usually a CAD system or similar.

Then there is a step of re-sampling the original pattern data dependent on the measured position data of the die(s) and on the transformed position and shape of the workpiece in order to fit data to each die on the workpiece in the coordinate system of the direct write machine. Alternatively, there is a step of re-sampling the original pattern data dependent on measured position data of a group or a cluster of the dies and on the transformed position and shape of the workpiece in order to fit data to each group or cluster on the workpiece in the coordinate system of the direct write machine.

912: Writing a pattern on the workpiece according to the adjusted circuit pattern data.

In a further development the measurement data is received and the steps 904-910 are performed in a sequence, thereby enabling measurement and writing in real time. Preferably, preparing of adjusted circuit pattern data is based solely on measurements and data associated with the workpiece, thereby enabling measurement and writing time in real time.

Different Transformation Options

In different embodiments of the invention there are different optional transformations.

The transformation of the pattern data, vector data or coordinate system to fit the spatial positions of the die(s) or groups/clusters of dies could be either linear or non-linear, such as e.g. a spline, polynomial or projective. Similarly, transforming the measured positions to transformed positions of the dies, i.e. single dies or group of dies, comprises a selection of linear or non-linear transformation. Further, the preparation of adjusted circuit pattern data comprises transforming of the pattern data to fit the positions of the dies, or group of dies, may comprise using a selection of linear or non-linear transformation.

Examples of optional, global or local, transformations according to different embodiment comprise a selection or a combination of: scale, rotation, mean only; affine transformation; projective transformation; bilinear interpolation, spline, polynomial.

Transformation of Coordinate System in Direct Write Machine

The inventive concept can also be applied in an embodiment where the coordinate system of the direct write machine is transformed to fit each die instead of re-sampling or re-rasterizing data. In other aspects this embodiment includes the features described above.

Figure 7:
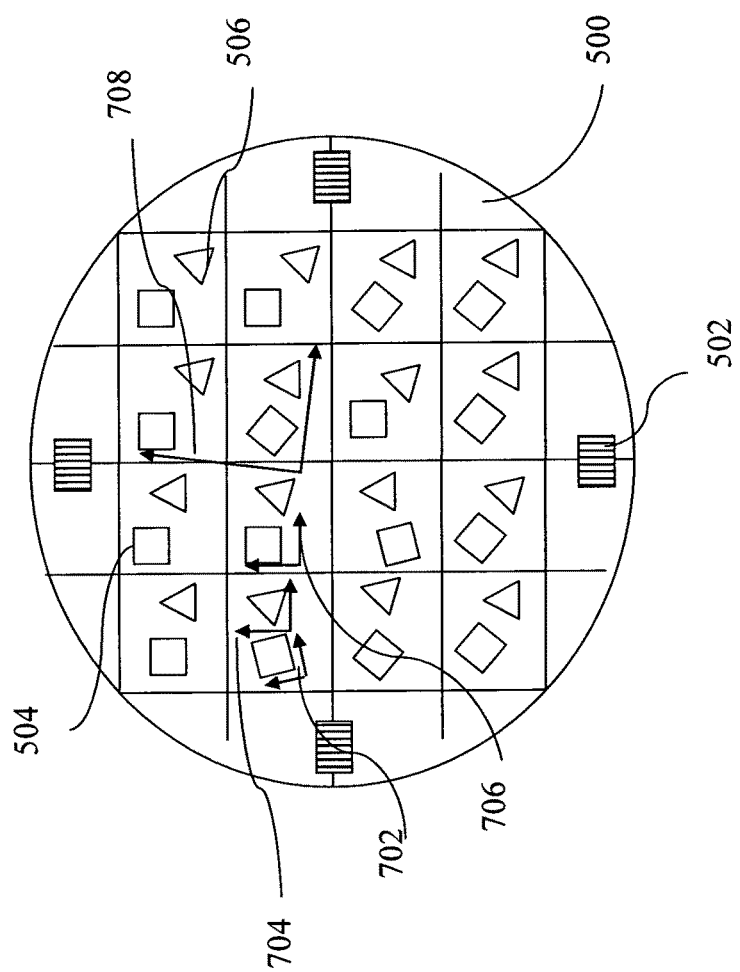
FIG. 7 shows schematically an example of adjustment of a local coordinate system in accordance with an embodiment of the invention.

FIG. 7 illustrates a workpiece similar to that of FIG. 5A and FIG. 5B and the coordinate system of the direct write machine being transformed to fit to the global workpiece in 708 and to individual dies in 702, 704, 706.

In summary this embodiment comprises a method for patterning a workpiece provided with dies in a direct write machine, wherein measurement data of positions of the dies in terms of location and orientation is used to determine a transformation of the coordinate system of the direct write machine such that a predetermined circuit pattern is fitted to each respective die. The predetermined pattern data is written on the workpiece according to the transformed coordinate system of the direct write machine.

In more detail such an embodiment would comprise a method for patterning a workpiece in a direct write machine, wherein the direct write machine being provided with a coordinate system for controlling write operations;

the workpiece having a plurality of dies distributed thereon;

each die being associated with a predetermined circuit pattern in the form of original pattern data; the method comprising the steps of:

a. receiving measurement data being associated with the workpiece and indicating a measured position of each die in relation to a reference feature of the workpiece;

b. detecting the predetermined reference feature of the workpiece;

c. determining the relation between the reference feature of the workpiece and the coordinate system of the direct write machine;

d. transforming the coordinate system of the direct write machine dependent on the measured position of each die and on the determined relation between the reference feature of the workpiece and the coordinate system of the direct write machine such that the predetermined circuit pattern is fitted to the dies on the workpiece;

e. writing a pattern on the workpiece according to the predetermined pattern data in the transformed coordinate system of the direct write machine.

Summarizing Embodiments of the Method

An embodiment of the inventive method for patterning a workpiece, for example a wafer, having a plurality of dies, comprises: measuring an alignment mark on the wafer or a reference die among the plurality of dies; measuring a position of at least a first of the plurality of dies; preparing pattern data based on the measured alignment mark and position of at least the first die; re-sampling the pattern data to fit the position of at least the first die; and writing a pattern on the wafer according to the re-sampled pattern data.

Another embodiment comprises: defining the measured position of the first die in a coordinate system of a writer by transforming the position of the first die to the coordinate system of the writer.

Figure 9B:
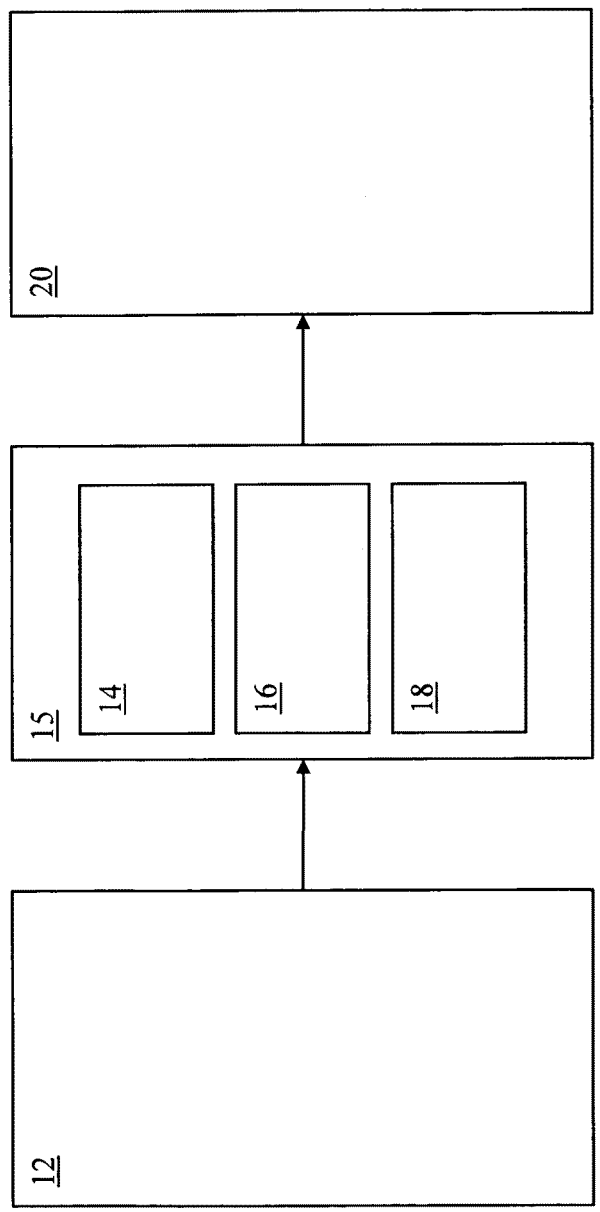
FIG. 9B shows schematically a block diagram illustrating embodiments of apparatus for patterning a workpiece in accordance with the invention.

The method for patterning a wafer having a plurality of dies, the method comprises: measuring an alignment mark on the wafer or a reference die among the plurality of dies; measuring a position of at least a first of the plurality of dies; preparing pattern data based on the measured alignment mark and position of at least the first die, the pattern data including vector data translated to fit at least the first die; rasterizing the pattern data; and writing a Embodiments of Apparatus for Patterning a Workpiece The inventive method is in preferred embodiments applied in a system of apparatus for patterning a workpiece. FIG. 9B shows schematically a block diagram of illustrating embodiments of apparatus for patterning a workpiece in accordance with embodiments of the invention. The system comprises apparatus units including at least one computer system configured to realizing any of the method steps and/or functions described above inter alia by means of specifically designed computer software program code or specifically designed hardware, or a combination thereof. A computer program product according to the invention comprises computer program code portions configured to control a computer system to perform any of the above described steps and/or functions of the method.

The apparatus illustrated in FIG. 9B comprises a measurement unit 12 that may be a separate measurement unit directly coupled to a writing tool 20 via a computer system 15 for example a laser direct imaging (LDI) computer system 15 and possibly also via a mechanical connection. In one embodiment the LDI computer system 15 receives a measurement file from a separated measurement unit by means of an arbitrary data carrier. The writing tool comprises for example a laser direct write machine.

The computer system 15 comprises a data preparation unit 14, a transformation unit and a writing tool control unit, preferably realized as software, and is communicatively coupled to the writing tool 20. The direct write machine of the writing tool is provided with a coordinate system for controlling write operations on a workpiece and a mechanism configured for detecting a reference feature on the workpiece, preferably by means of imaging technology.

Embodiments of the computer system 15 further comprises a unit for determining the relation between at least one reference feature of the workpiece and the coordinate system of the direct write machine. A data preparation unit 14 also comprised in the computer system 15 is configured to prepare pattern data before and/or after transformation. A transformation unit 16 is in one embodiment configured to transforming the measured position of a plurality of dies to a transformed position defined in the coordinate system of the direct write machine comprised in the writing tool 20 dependent on a determined relation between the at least one reference feature of the workpiece and the coordinate system of the direct write machine. In one variation the transformation unit 16 comprises a re-sampling unit configured to resample the pattern data to fit the dies. In another variation the transformation unit 16 comprises a rasterizer configured to rasterize the pattern data.

The data preparation unit 14 is in one embodiment configured to preparing adjusted circuit pattern data for writing on the workpiece dependent on both the original pattern data and the transformed positions, wherein the adjusted circuit pattern data represents the circuit pattern of the plurality of dies, or group of dies, such that the adjusted circuit pattern is fitted to a plurality of sub-areas of the workpiece area, and wherein each sub-area is associated with a die, or group of dies, among the plurality of dies distributed on the workpiece. The writing tool control unit 18 is configured to control the direct write machine of the writing tool to writing a pattern on the workpiece according to the adjusted circuit pattern data. Similarly, different embodiments of the units of the apparatus are configured to carry out the various embodiments of the method.

In an alternative embodiment of the inventive concept the transformation unit 16 is configured to transform the coordinate system of the writing tool, e.g. a direct write machine, as described above.

Summarizing Embodiments of the Apparatus

An embodiment of the inventive apparatus for patterning a workpiece, for example a wafer, having a plurality of dies, the workpiece or wafer having a plurality of dies, the apparatus comprising: at least one measurement unit configured to measure an alignment mark for the wafer or a reference die among the plurality of dies, and configured to measure a position of a first of the plurality of dies; a data preparation unit configured to prepare pattern data based on the measured alignment mark and position of the first die; a re-sampling unit configured to resample the pattern data to fit the position of at least the first die; and a writing tool configured to write a pattern on the wafer according to the re-sampled pattern data.

In one embodiment of the apparatus, the measurement unit is further configured to define the measured position of the first die in a coordinate system of a writer by transforming the position of the first die to the coordinate system of the writer.

In another embodiment, an apparatus for patterning a workpiece, for example a wafer, having a plurality of dies, the apparatus comprises: a measurement unit configured to measure an alignment mark on the wafer or a reference die among the plurality of dies, and configured to measure a position of at least a first of the plurality of dies; a data preparation unit configured to prepare pattern data based on the measured alignment mark and position of at least the first die, the pattern data including vector data translated to fit at least the first die; a rasterizer configured to rasterize the pattern data; and a writing tool configured to write a pattern on the wafer according to the rasterized pattern data.

In a further embodiment, the measurement unit is configured to define the measured position of the first die in a coordinate system of a writer by transforming the position of the first die to the coordinate system of the writer.

Determining the Coordinate System and Performing Alignment with Reference Board

The coordinate system in a write machine, such as direct writer in an LDI system, can be determined in different manners, for example by detecting a reference scale or a reference board; or by structural mechanisms such as the positions of cameras, the positions being considered to be fixed; or by using light measurements such as interferometrics.

In an example embodiment the determining of the coordinate system of a write machine is carried out by means of a reference board in the following setup. The reference board is applied in a writing system and an alignment system comprising a measurement station and a reference board mounted on a workpiece carrier stage. The alignment system thus includes a measurement station with a camera bridge on which, in this example, a plurality of camera systems are mounted, and a reference board mounted on each of a plurality of workpiece carrier stages. There may be one or a plurality of cameras comprised in the measurement station. The carrier stages move between measurement station of the alignment system and the writing system. A computer is operatively and/or communicatively coupled to the measurement station of the alignment system and the writer system. In operation, typically a plurality of carrier stages are used to carry separate workpieces for patterning. The carrier stages are typically displaceable on a carrier stage track between a measurement position in the measurement station and a writing station in the writer.

A reference board is attached to each carrier stage. The reference board may for example be composed of a temperature stable material such as QZ (quartz). The reference board carries information between the measurement station coordinate system of the alignment system and the writer coordinate system.

The reference board is preferably attached to the carrier stage in such a manner that the reference board is fixed to the carrier stage. For example, as in one embodiment, the reference board is fastened or joined to the carrier stage by bolts or screws. Preferably, a joint would be arranged in combination with a flexural joint mechanism to compensate for tensions for example due to temperature changes. In another embodiment, the reference board is glued to carrier stage.

Reference features, for example in the form of a grid pattern are provided on the reference board. The reference features may comprise marks constituting board reference features including circles in the form of filled circles and annular ring shaped circles. The positions of the marks are either known from a sufficiently accurate measurement machine or written by equipment such that the marks are assumed to be ideal. In one example application of the invention, the positions of the marks are measured, and the measured positions of the marks are compared to nominal positions to create a compensation map. The compensation map addresses the residual error and is used in the alignment process to create an adjusted pattern.

In a more general sense, the reference board is implemented for associating the reference features with the carrier stage by integrating the reference features directly with the carrier stage. This is inter alia used in a method for calibrating the alignment system.

The reference board can be used to determine the coordinate system of a write machine in an alignment process. Such an alignment process described in a general wording is typically applied in a setting wherein a pattern generating tool according comprises a reference board attached or fixed to a stage, the reference board being configured to carry alignment information between the alignment system and a writing tool. One or more cameras are mounted on a camera bridge, and the one or more cameras are configured to measure positions of alignment marks on a substrate relative to the reference board, the substrate being attached or fixed to the stage. A writing system is configured to expose the substrate. A computer is operatively coupled to the alignment system and writer system.

The method comprises the steps of providing a reference board attached to the carrier stage, the reference board having board reference features on predetermined nominal positions; measuring at least once, in the measurement station, the position, e.g. location and orientation, of at least one of the reference features of the workpiece relative the reference board; displacing the carrier stage with the reference board from the measurement station to the writing station; calibrating the writing station by measuring the position of the reference board using at least one of the board reference features of the reference board.

Further, the embodiments of the method comprise a selection of optional calibration steps. Firstly, the method may include the step of calibrating the writing station by measuring the position of the reference board using at least one of the board reference features of the reference board.

Secondly, the method may include the step of calibrating the measurement station to the reference board by measuring, in the measurement station, at least one of the board reference features of the reference board.

The calibrating of the measurement station comprises, in one variation the steps of:

determining the scale error and distortion for each camera in the measurement station by measuring the positions of board reference features arranged in a uniform or non uniform grid pattern on the reference board and comparing with nominal positions of the board reference features;

calculating a lens distortion map dependent on the measured scale error distortions of the cameras, the map can hold only the non linear scale errors/distortions or also the global linear scale error;

calculating the landing angle of the camera by measuring position of reference boards at different height;

determining the position of each camera in the measurement station relative the reference board by:

detecting the position of board reference features on the reference board;

calculating the position of each camera dependent on a predetermined relationship between the position of the board reference features and a reference point on the reference board;

calculating the rotation of each camera as the rotation between the pattern and the coordinate system associated with the camera.

The calibration of the write machine and optionally also the measurement system is thus advantageously used for determining the coordinate system of the write machine.

When patterning and aligning according to various embodiments as described above, this may be carried out using a reference board according to the following method:

A method of patterning a layer of a workpiece in a write machine, where the write machine comprises:

a pattern writing station provided with a write machine coordinate system; and a measurement station provided with a measurement coordinate system, the measurement station being configured to perform measurements of objects on a workpiece associated with reference features, where the workpiece is further placed on a carrier stage and where the write machine is configured to displace the carrier stage between the measurement station and the writing station; the method comprising the steps of:

a. providing a reference board attached to the carrier stage, the reference board having board reference features on predetermined nominal positions;

b. measuring at least once, in the measurement station, the position, e.g. location and orientation, of at least one of the reference features of the workpiece relative the reference board;

c. calculating a transformation dependent on both the measured reference position(s) and on the nominal position(s) of the reference feature(s) of the workpiece, the transformation describing the deviation of the measured positions from the nominal position(s);

d. displacing the carrier stage with the reference board from the measurement station to the writing station;

e. writing the pattern on the workpiece by adjusting for the transformation describing the deviation of the measured position(s) from the nominal position(s).

The alignment method may further include the step of calculating a transformation comprises:

the action of calculating adjusted pattern data according to the transformation, and fitting the adjusted pattern data to the position of the workpiece being given relative the position of the reference board; and wherein the step of writing the pattern on the workpiece is performed by exposing the work piece according to the adjusted pattern data.

Further embodiments are developed wherein: the calculation of the adjusted pattern data for writing on the work piece is dependent on measured positions of the reference features of the work piece relative a board reference feature of the reference board, and wherein the reference board represents the coordinate system of the carrier stage by having a attached relative distance to the carrier stage.

The method further comprising the step of calibrating the writing station by measuring the position of the reference board using at least one of the board reference features of the reference board.

The method further comprising the step of calibrating the measurement station to the reference board by measuring, in the measurement station, at least one of the board reference features of the reference board.

A carrier stage for use in a write machine configured for patterning of a layer of a workpiece, wherein reference features are associated with the carrier stage, the reference features having predetermined nominal positions.

The carrier stage for this purpose comprises a reference board is attached to the carrier stage, the reference board having board reference features on predetermined nominal positions. The reference features and/or the reference board is configured with an orientation on the carrier stage:—orthogonally in relation to the main movement direction of the reference board; and/or coaxially in relation to the main movement direction of the reference board. The reference features and/or the reference board may for example be configured: in an elongate shape;—in an L-shape, and wherein the reference board for example is attached to the carrier stage by:—a screw or bolt joint;—a glue joint.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

What is claimed is:

1. A method for patterning a layer of a workpiece in a direct write machine, wherein the direct write machine is provided with a coordinate system for controlling write operations and the workpiece has dies distributed thereon, wherein the dies distributed on the workpiece are associated with a circuit pattern in the form of original circuit pattern data representing the whole workpiece, the method comprising:

receiving measurement data associated with the workpiece and indicating measured positions of a plurality of the dies distributed on the workpiece in relation to at least one reference feature of the workpiece;

detecting the at least one reference feature of the workpiece;

determining a relation between the at least one reference feature of the workpiece and the coordinate system of the direct write machine;

transforming the measured positions of the plurality of dies distributed on the workpiece to transformed positions defined in the coordinate system of the direct write machine based on the determined relation between the at least one reference feature of the workpiece and the coordinate system of the direct write machine;

preparing adjusted circuit pattern data for writing on the workpiece by resampling the original circuit pattern data representing the whole workpiece based on the transformed positions and the original circuit pattern data representing the whole workpiece, wherein the adjusted circuit pattern data is fitted to the plurality of dies on the whole workpiece within at least one pre-settable deviation parameter, wherein the adjusted circuit pattern data represents an electric circuit pattern coupling connection points, or contact pads, of the plurality of dies on the whole workpiece, and the resampling of the original pattern data representing the whole workpiece is also dependent on the measured positions of the plurality of dies as well as the transformed position and shape of the workpiece, in order to fit data to each die on the workpiece in the coordinate system of the direct write machine; and writing a pattern on the whole workpiece according to the adjusted circuit pattern data to form the electric circuit pattern coupling the connection points, or contact pads, of the plurality of dies on the whole workpiece.

2. The method of claim 1, wherein the adjusted circuit pattern data is rendered to be fitted to the plurality of dies such that sub-portions of the adjusted pattern data each represent a sub-area of the whole workpiece associated with a particular portion of the plurality of dies and wherein each of said sub-areas includes, or covers, said particular portion of the plurality of dies.

3. The method of claim 1, wherein the whole workpiece is divided into a plurality of sub-areas that each are to be represented by sub-portions of the adjusted pattern data, and wherein the whole workpiece is divided into the plurality of sub-areas according to a pre-determined algorithm.

4. The method of claim 1, wherein a plurality of sub-areas of the whole workpiece are automatically identified by the received measurement data and the whole workpiece is automatically divided into the plurality of sub-areas according to a pre-determined algorithm.

5. The method of claim 1, wherein a plurality of sub-portions of the adjusted circuit pattern data are rendered to fit to respective sub-areas of the whole workpiece within at least one of certain requirements and the at least one pre-settable deviation parameter.

6. The method of claim 5, wherein the at least one of certain requirements and the at least one pre-settable deviation parameters are associated with at least one of:
a type of die, component, group of dies, or group of components;
a characteristic of the surface structure of the die, component, group of dies, or group of components; and
a characteristic of the shape of the die, component, group of dies, or group of components.

7. The method of claim 5, wherein the at least one pre-settable deviation parameter includes at least one parameter associated with location and at least one parameter associated with orientation.

8. The method of claim 1, wherein the entire adjusted circuit pattern is fitted to the plurality of dies on the whole workpiece within the at least one pre-settable deviation parameter or set of deviation parameters.

9. The method of claim 1, wherein the plurality of dies includes all dies distributed on the whole workpiece.

10. The method of claim 1, wherein the positions of the plurality of dies in terms of both location and orientation together with workpiece location and orientation relative to the coordinate system is used to determine a transformation of the measured positions defined in the coordinate system of the direct write machine.

11. The method of claim 1, wherein the positions of the plurality of dies is determined in terms of at least one of:
a location and the orientation of the plurality of dies on the workpiece in relation to the at least one reference feature; and a spatial location and orientation of the plurality of dies in a space including the workpiece in relation to the at least one reference feature.

12. The method of claim 11, wherein a reference feature of a die is determined by a selection of one of:
at least one alignment mark provided on the die;
a characteristic of a surface structure of the die;
a characteristic of a shape of the die; and
measurement on a writing side or on a backside of the workpiece.

13. The method of claim 1, wherein the at least one reference feature of the workpiece is determined by a selection or combination of at least one of:
at least one alignment mark provided on the workpiece;
at least one reference feature provided on at least one reference die selected from among the plurality of dies;
a characteristic of an arrangement of the dies distributed on the workpiece;
a characteristic of a surface structure of the workpiece;
a characteristic of a surface structure of the at least one die;
the at least one reference die;
a characteristic of a shape of the workpiece; and
measurement on a writing side or on a backside of the workpiece.

14. The method of claim 1, wherein the position of a die is determined by one of:
determining a spatial position of the die in relation to the at least one reference feature by selection of a shape based position determining algorithm, an edge detection based algorithm, a correlation based algorithm or another image analysis technique devised for extracting a position from the at least one reference feature;
determining the spatial position of the die in relation to the at least one reference feature with at least one alignment mark on the die; or
determining the spatial position of the die in relation to the at least one reference feature by a characteristic of the surface structure of the die.

15. The method of claim 1, wherein the preparing of adjusted circuit pattern data further comprises:
transforming the original pattern data representing the whole workpiece in the form of vector data to fit the plurality of dies to the whole workpiece; and
rasterizing said transformed vector data.

16. The method of claim 1, wherein the preparing of adjusted circuit pattern data further comprises:
transforming the original pattern data representing the whole workpiece in the form of vector data to fit the plurality of dies to the whole workpiece; and
rasterizing said transformed vector data such that the rasterized vector data represents the whole workpiece.

17. The method of claim 1, further comprising:
transforming pattern data, vector data or a coordinate system to fit the spatial positions of the plurality of dies either linearly or non-linearly.

18. The method of claim 1, wherein the measurement data indicating the positions of the plurality of dies on the workpiece is determined:
in a separate measurement machine, and including a list of transformations and areas covered by the transformations, or data describing the transformation in a given point; or
in a measurement arrangement that is integrated with or integrated in the direct write machine.

19. The method of claim 1, wherein the measurement data is received and the detecting, determining, transforming, and preparing are performed in a sequence, thereby enabling measurement and writing in real time.

20. The method of claim 1, where the plurality of dies are passive components, active components, or any other components associated with electronics.

21. The method of claim 1, wherein the preparing of adjusted circuit pattern data further comprises:
    transforming the pattern data to fit the positions of the plurality of dies using a selection of linear or non-linear transformations.

22. The method of claim 1, wherein transforming the measured positions to transformed positions comprises a selection of linear or non-linear transformations.

23. The method of claim 1, wherein the adjusted circuit pattern data is fitted to the plurality of dies on the whole workpiece within the at least one pre-settable deviation parameter that is set to less than 100 µm for the plurality of dies distributed on the whole workpiece.

24. The method of claim 1, wherein the adjusted circuit pattern data is fitted to the plurality of dies on the whole workpiece within the at least one pre-settable deviation parameter that is set to less than 10 µm for the plurality of dies distributed on the whole workpiece.

25. The method of claim 1, wherein the adjusted circuit pattern data is fitted to the plurality of dies on the whole workpiece within the at least one pre-settable deviation parameter that is set to less than 5 µm for the plurality of dies distributed on the whole workpiece.

26. The method of claim 1, wherein the adjusted circuit pattern data is fitted to the plurality of dies on the whole workpiece within the at least one pre-settable deviation parameter that is set to less than 1 µm for the plurality of dies distributed on the whole workpiece.

27. An apparatus for patterning a workpiece in a direct write machine, where the direct write machine is provided with a coordinate system for controlling write operations and the workpiece has dies distributed thereon, wherein the dies distributed on the workpiece are associated with a circuit pattern in the form of original circuit pattern data representing the whole workpiece, the apparatus comprising:
    a computer system configured to receive measurement data associated with the workpiece and indicating a measured position of a plurality of the dies distributed on the workpiece in relation to at least one reference feature of the workpiece;
    a detector configured to detect the at least one reference feature of the workpiece;
    a computerized unit configured to determine a relation between the at least one reference feature of the workpiece and the coordinate system of the direct write machine;
    a transformation unit configured to transform the measured positions of the plurality of dies distributed on the workpiece to transformed positions defined in the coordinate system of the direct write machine based on the determined relation between the at least one reference feature of the workpiece and the coordinate system of the direct write machine;
    a data preparation unit configured to prepare adjusted circuit pattern data for writing on the workpiece by resampling the original circuit pattern data representing the whole workpiece based on the transformed positions and the original pattern data representing the whole workpiece, wherein the adjusted circuit pattern data is fitted to the plurality of dies on the whole workpiece within at least one pre-settable deviation parameter, wherein
        the adjusted circuit pattern data represents an electric circuit pattern coupling connection points, or contact pads, of the plurality of dies on the whole workpiece, and
        the resampling of the original pattern data representing the whole workpiece is also dependent on the measured positions of the plurality of dies as well as the transformed position and shape of the workpiece, in order to fit data to each die on the workpiece in the coordinate system of the direct write machine; and
    a writing tool control unit configured to control a writing tool to write a pattern on the workpiece according to the adjusted circuit pattern data to form the electric circuit pattern coupling the connection points, or contact pads, of the plurality of dies on the whole workpiece.

28. An apparatus for patterning a workpiece in a direct write machine, the apparatus being configured to perform the method according to claim 1.

29. A non-transitory computer readable medium including computer program code portions configured to control a computer system for patterning a workpiece in a direct write machine, where the direct write machine is provided with a coordinate system for controlling write operations and the workpiece has dies distributed thereon, wherein the dies distributed on the workpiece are associated with a circuit pattern in the form of original circuit pattern data representing the whole workpiece, the computer program code portions being configured to control a computer system to perform a method comprising:
    receiving measurement data associated with the workpiece and indicating measured positions of a plurality of the dies distributed on the workpiece in relation to at least one reference feature of the workpiece;
    detecting the at least one reference feature of the workpiece;
    determining a relation between the at least one reference feature of the workpiece and the coordinate system of the direct write machine;
    transforming the measured positions of the plurality of dies distributed on the workpiece to transformed positions defined in the coordinate system of the direct write machine based on the determined relation between the at least one reference feature of the workpiece and the coordinate system of the direct write machine;
    preparing adjusted circuit pattern data for writing on the workpiece by resampling the original circuit pattern data representing the whole workpiece based on the transformed positions and the original pattern data representing the whole workpiece, wherein the adjusted circuit pattern data is fitted to the plurality of dies on the whole workpiece within at least one pre-settable deviation parameter, wherein
        the adjusted circuit pattern data represents an electric circuit pattern coupling connection points, or contact pads, of the plurality of dies on the whole workpiece, and
        the resampling of the original pattern data representing the whole workpiece is also dependent on the measured positions of the plurality of dies as well as the transformed position and shape of the workpiece, in order to fit data to each die on the workpiece in the coordinate system of the direct write machine; and
    controlling a writing tool for writing a pattern on the whole workpiece according to the adjusted circuit pattern data to form the electric circuit pattern coupling the connection points, or contact pads, of the plurality of dies on the whole workpiece.

* * * * *